United States Patent
Baumgartl et al.

(10) Patent No.: US 6,339,717 B1
(45) Date of Patent: Jan. 15, 2002

(54) MEDICAL EXAMINATION SYSTEM, PARTICULARLY A MAGNETIC RESONANCE SYSTEM

(75) Inventors: Rudi Baumgartl, Erlangen; Robert Krieg, Nuremberg; Georg Pirkl, Dormitz; Markus Vester, Nuremberg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/513,181

(22) Filed: Feb. 25, 2000

(30) Foreign Application Priority Data

Mar. 17, 1999 (DE) .......................................... 199 11 988

(51) Int. Cl.$^7$ ................................................ A61B 5/05
(52) U.S. Cl. ........................ 600/407; 600/422; 600/425; 600/437; 702/8; 345/41.8; 378/145; 378/156; 382/128; 382/130; 382/131; 382/132
(58) Field of Search ................................ 600/300, 310, 600/407, 437, 425, 422; 702/8; 345/41.8; 378/145, 56; 382/128, 130, 131, 132

(56) References Cited

U.S. PATENT DOCUMENTS

| 5,381,518 | A | | 1/1995 | Drebin et al. | |
|---|---|---|---|---|---|
| 5,492,125 | A | | 2/1996 | Kim et al. | |
| 5,805,236 | A | * | 9/1998 | Roth | 348/571 |
| 6,046,591 | A | * | 4/2000 | King et al. | 324/309 |
| 6,106,472 | A | * | 8/2000 | Chiang et al. | 600/447 |
| 6,115,486 | A | * | 9/2000 | Cantoni | 382/128 |
| 6,169,816 | B1 | * | 1/2001 | Ravkin | 382/128 |
| 6,171,244 | B1 | * | 1/2001 | Finger et al. | 600/437 |
| 6,195,579 | B1 | * | 2/2001 | Carroll et al. | 600/420 |

FOREIGN PATENT DOCUMENTS

DE    OS 195 19 125    11/1996

* cited by examiner

Primary Examiner—Marvin M. Lateef
Assistant Examiner—Jeoyuh Lin
(74) Attorney, Agent, or Firm—Schiff Hardin & Waite

(57) ABSTRACT

A medical examination system, particularly a magnetic resonance system, has a host computer unit, a control computer unit and an image computer unit. The control computer unit is realized in the form of at least one insert card that is arranged in a commercially obtainable personal computer that contains the host computer unit.

18 Claims, 3 Drawing Sheets

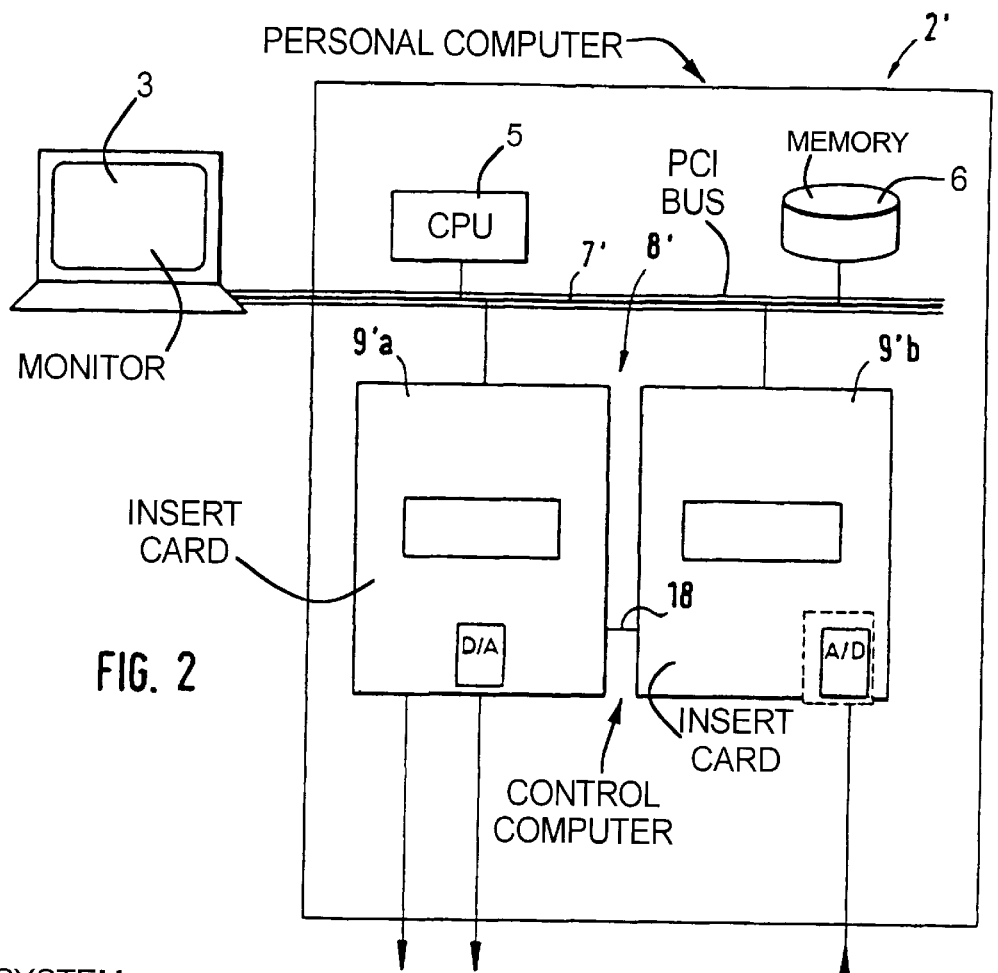
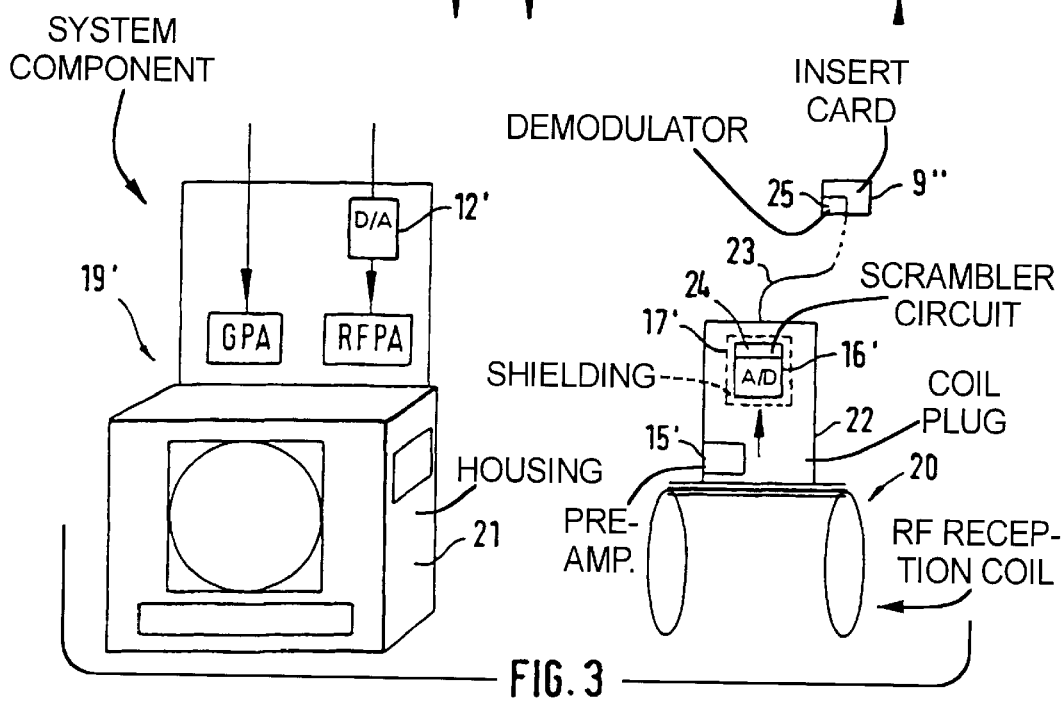

MEDICAL EXAMINATION SYSTEM, PARTICULARLY A MAGNETIC RESONANCE SYSTEM

BACKGROUND OF THE INVENTION

1. Field of the Invention

The present invention is directed to a medical examination system, particularly a magnetic resonance system, of the type having a host computer unit, a control computer unit for controlling the system operation, and an image computer unit.

2. Description of the Prior Art

In known examination systems of this type, for example in the form of magnetic resonance systems, this so-called three-computer architecture is utilized for the overall functioning of the system. In the host computer unit, all patient data are normally stored and the patient data registration and selection as well as the operation of the system usually ensue via this host computer. The control computer unit that controls the time executions and sequences of the functional components of the system, i.e., for example, the gradient coils as well as the radio-frequency coil or coils and the magnet in the case of a magnetic resonance system. The image computer unit receives and further processes (edits) the image signals obtained from a scanner and from these edited image signals medically relevant diagnostic images are constituted. A number of different hardware components are thus required. Another disadvantage is that, since these computers are usually stand-alone assemblies, these are very large in volume and are accommodated in separate cabinets or racks, and are usually arranged spatially separated from each other. The fact that known systems are constructed of stand-alone, usually customized, components also has an extremely disadvantageous effect on the manufacturing costs of the system, since no standardized components are utilized.

German OS 37 12 639 discloses a method and an apparatus for imaging volume data, whereby a two-dimensional display of a three-dimensional data set of image data of a registered subject is produced. This known apparatus has an imaging system, i.e. an image processing system, with a host computer or processing computer that serves for the manipulation of a histogram generated from image data stored in an image memory. Further, a lookup table can be stored therein, this containing previously allocated color and opacity values for each spike identity location in the histogram; further, the user can determine defined color and opacity values via the processing computer. A video control device is provided that supplies the vertical and horizontal synchronization for a color monitor serving the purpose of displaying the images and also has a buffer memory for the display of picture screen data.

German OS 195 19 195 discloses a manually actuated input device in the form of a mouse or a keyboard that serves the purpose of entering control commands into a computer. This input device includes a transducer module with which measured data to be further-processed in the computer system can be acquired, and a switch with which the input device can be switched from a working mode to a measured data registration mode wherein the transducer module is activated and the measured data externally supplied to the input device can be transmitted to the computer system for processing.

German OS 196 04 787 discloses an ultrasound signal processing device that offers a programmable platform for different clinical ultrasound applications and that is a component of a medical ultrasound diagnosis imaging system.

SUMMARY OF THE INVENTION

An object of the present invention is to provide an examination system that is simplified in structure and more favorable in terms of manufacture compared to known systems.

This object is inventively achieved in a medical examination system of the type initially described wherein the control computer unit is realized in the form of at least one insert card that is arranged in a commercially obtainable personal computer that contains the host computer unit, the personal computer operating with an operating system capable of real time that supports the host computer unit and the insert card.

A commercially obtainable, conventional personal computer that has the necessary performance capabilities is utilized in the inventive examination system. The control computer unit is particularly advantageously realized in the form of at least one insert card, or possibly multiple insert cards, that are plugged in the conventional PC, which simultaneously functions as the host computer unit. I.e., a commercially obtainable PC thus serves both as the host computer unit as well as the control computer unit. Since standardized (as to format) insert cards are used, it is possible without difficulty to employ any commercially obtainable personal computer for this purpose. The invention departs from the employment of stand-alone usually large-volume and separate computer units and, instead integrates at least the host computer unit and the control computer unit in a conventional personal computer. This also results in the further advantage that only a single processor, namely the correspondingly powerful processor of the personal computer is required. This then functions both as the operating processor (corresponding to the host tasks) as well as the control processor. Since only one computer is required instead of the conventional separate host and control computer units, further, installation is significantly simpler, and fewer connecting and communication lines are required in the installation. Moreover, the separate system room in which the control computer unit is conventionally arranged can be eliminated. Due to the more compact structure and the lower number of connecting lines, further, maintenance outlay for the system is reduced.

It has proven advantageous when the image computer unit also is realized in the form of at least one insert card and is integrated in the personal computer. In this embodiment of the invention, thus, all computer units, provided as separate units in the prior art, are integrated in a single computer; only one device is thus required and the level of integration is even higher.

Inventively, the operating system can be a standard operating system, for example a Windows® operating system (i.e., a windows-based graphical operating system), that works in conjunction with a real time operating system. The control of a medical examination system makes "hard" real time demands of the operating system, which are understood to include response times in the range of approximately 1 msec. Since a standardized operating system cannot meet these demands by itself, the invention also provides for the connection of this standard operating system, for example an ordinary Windows® operating system, to a real-time operating system, whereby the standard operating system performs tasks of the real-time operating system, for example the system "VxWorks". This offers the substantial advantage that the standardized operating system can be used with its known, simple operation as a user interface as well as a programming interface, i.e. the system operation is similarly simple to the normal operation of a computer operating with this standardized operating system. The real-time operating system itself is activated by a non-deactivatable interrupt, so that it always has a higher priority than the standard operating system. Since both are standardized operating systems, the invention advantageously does not require a customized system, this likewise leading to a reduction of the acquisition costs. Alternatively to the use of two operating systems, one standard operating system can be appropriately inventively modified to meet the real-time demands. This can ensue, for example, with a modification of the "hardware abstraction layers" of, for example, the operating system "Windows® NT" by a modification of the priority control of the drivers, thereby achieving the "hard" real time operation.

The respective insert card or cards of the control computer unit and/or of the image computer unit are preferably in a communication connection with the main processor of the personal computer via the PCI bus, i.e. the PC-inherent input/output bus is used for data transfer. In addition to the working processor, memory devices, hard disks and peripheral devices also are attached connected to the PCI bus.

As a result of the integration of the control computer unit, to which the image signals registered with the image signal reception system are supplied for initial processing, problems can occur if these signals are disturbed, which could then lead to artifacts in the image that is produced as an output, since the switching events of the personal computer cause high-frequency noise signals. Such disturbances, however, affect only analog high-frequency image signals; such disturbance is precluded after a conversion into digital signals. Since the image signal reception system receives analog signals, which are converted into digital signals with an A/D converter, a disturbance caused by the switching events of the personal computer can occur at the point in time preceding the conversion of these signals. In order to alleviate this situation, an A/D converter can be inventively provided at each insert card of the control computer unit, this being in communication via a signal line with an image signal reception system and receiving analog image signals. The A/D converter and, if needed, the signal line as well, are provided with a shielding. In this embodiment of the invention, thus, the A/D converter that is directly arranged on the insert card is shielded; the rest of the insert card can remain unshielded. This shielding prevents disadvantageous influences by any noise signals produced at the computer side. Of course, it is also expedient to provide the signal line with a shielding.

Alternatively, the A/D converter, to which the analog image signals registered by an image signal reception system are provided, can be arranged outside the personal computer and can communicate with each insert card of the control computer unit via a signal line. The A/D converter in this embodiment thus is external from the computer, so that noise signals generated at the computer side cannot have a negative influence, since only signals that are already in digital form and that can no longer be influenced by such noise are supplied into the computer.

If the examination system is a magnetic resonance system, the A/D converter (or converters, if multiple insert cards are used) can be arranged in the region of the magnet of the examination system fashioned as magnetic resonance system. In an alternative embodiment of the invention, the A/D converter (or converters) is arranged at a filter plate of a radio-frequency-shielded cabin containing a part of the magnetic resonance system. All components that are directly required for the examination of the patient are arranged in this cabin. All signals entering into the cabin are filtered with an LC filter at this filter plate in order to prevent disturbances from being produced.

In a further embodiment, the AD converter(or converters) can be arranged close to the radio-frequency coils of the image signal reception system, when the examination system is fashioned as a magnetic resonance system. In this embodiment, thus, the converter is arranged inside the radio-frequency-shielded cabin. The A/D converter can be arranged in a connecting plug with which the signal line is connected to the radio-frequency coils. In addition to the external arrangement of the converter, it has also proven advantageous when the A/D converter itself, or the connecting plug has a shielding, for example in the form of a metal housing, a wire mesh or the like. It has also proven advantageous when the signal line is a light waveguide. As a result, the emission by the signal line via which the image signals are forwarded and the disturbing feedback onto preceding devices arising as a result thereof such as, for example, the antenna of the image signal reception system, can be kept as small as possible.

It has also proven advantageous to provide a circuit for scrambling the image signals registered with the image reception system and to be transmitted from the A/D converter to the image computer. Coherent disturbances which would act on the image signals of the reception data can be attenuated by such data scrambling, i.e., the feedback of the reception signal through the connecting line between the A/D converter and, for example, the antenna of the reception system is thereby reduced. During scrambling, the digitalized image signal is "exclusive-OR" operated with pseudo statistical random numbers. This spectrally smears any systematic components which may be contained in the data that correspond to discrete spectral lines that may be coupled into the analog signal part. Upon reception of the data in the personal computer, a demodulation is implemented with the same numerical sequence, so that the image signal is in turn restored. Of course, further noise suppression possibilities can be utilized in common for the maximum prevention of possible disturbances.

DESCRIPTION OF THE DRAWINGS

FIG. 2 shows a portion of the system of FIG. 1 with two insert cards forming the control computer unit.

FIG. 3 shows a portion of the system of FIG. 1 with an A/D converter arranged at the connecting plug of the radio-frequency coils.

DESCRIPTION OF THE PREFERRED EMBODIMENTS

Figure 1:
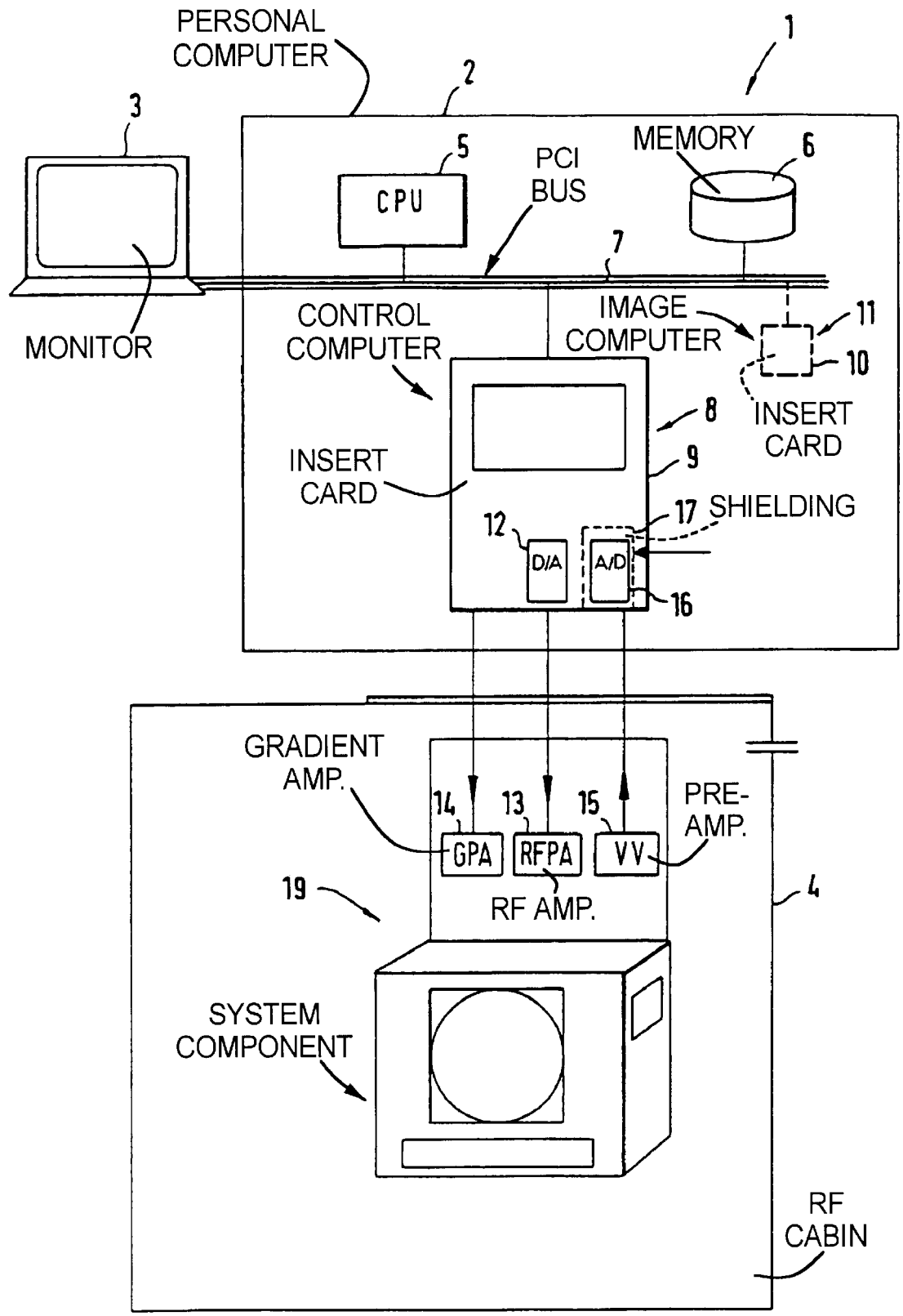
FIG. 1 is a schematic illustration of an inventive medical examination system in the form of a magnetic resonance system.

In a schematic illustration, FIG. 1 shows an inventive medical examination system in the form of a magnetic resonance system 1. This includes a personal computer 2, which is a commercially obtainable device, i.e. not a main frame or dedicated computer. A monitor 3 is allocated thereto, which serves for use in the operation of the system, but at which the registered examination images can also be displayed. The system components 19 of the actual examination part of the magnetic resonance system 1, i.e. the scanner and associated components with which the patient is directly examined, are arranged in a radio-frequency-shielded cabin 4 in communication with the personal computer 2. Since the specific structure of this examination part is not of importance to the present invention, this has been shown as an example.

The personal computer 2 has a main processor 5 (CPU) as well as a memory 6 that are in communication with one another via a PCI bus 7. Further, an insert card 9 forming the control computer unit 8 is connected to the PCI bus 7. This insert card 9 controls the components located in the cabin 4 as well as controlling the reception and processing of the image signals registered with these components. This insert card 9, which—as known for commercially obtainable personal computers—can be plugged in a simple way at a corresponding interface to the PCI bus 7, is a standardized format card in terns of the plug connection, so that it can be introduced it into any arbitrary commercially obtainable personal computer. In addition to assuming the control functions, which is enabled with the inserted insert card 9, this personal computer 2 also assumes the functions of the host computer unit that serves for the administration of the patient data. Since the insert card 9 is intended to serve for the entire system control, the use of high-integration component parts is required.

The insert card 10 is merely shown with broken lines, alternatively since it can be arranged externally from the personal computer 2. The insert card 9 forming the control computer unit 8 assumes the following functions during the operation of the magnetic resonance system 1, whereby it is assumed to be known what system components or assemblies are controlled or addressed, since these are compulsory in a magnetic resonance system.

Generating the waveform for the radio-frequency pulse excitation. These waveforms must be communicated to the transmitter at the actual magnetic resonance frequency. To that end, the waveforms are usually modulated with a reference oscillator. In the exemplary embodiment, a fast D/A converter 12 that is arranged directly at the insert card 9 is utilized for this purpose. This forwards the waveforms to a radio-frequency amplifier 13. The modulation here occurs previously on a digital level.

Generating the gradient pulse forms. In the exemplary embodiment, the gradient pulse forms are digitally calculated and are then forwarded to the gradient amplifier 14.

Reception of the magnetic resonance image signals registered with the reception system. The received image signals are amplified in a pre-amplifier 15 and are then forwarded to the insert card 9. They are demodulated and further-processed at the insert card 9. In the exemplary embodiment, the given image signal is directly sampled and the demodulation subsequently ensues digitally. An A/D converter 16, which is arranged directly at the insert card 9 in the illustrated exemplary embodiment, serves for converting the analog image signals forwarded to the insert card 9 into digital signals. A shielding 17 is provided for shielding the converter 16 against high-frequency noise signals which may be generated at the computer side; a shielding can also be provided for the signal line from the pre-amplifier 15 to the A/D converter 16. After the conversion, the digital data can be demodulated and processed in the unshielded part of the insert card 9.

The insert card 9 can also assume further functions, for example calculating the eddy current compensation, the radio-frequency characteristic correction, an image calculation, a monitoring of the radio-frequency coils, SAR monitoring, a stimulation monitoring, etc.

In addition to the insert card 9 forming the control computer unit 8, the further insert card 10 that forms the image computer unit 11 can be plugged to the PCI bus 7. This is also a standardized format card that can be plugged into any commercially obtainable personal computer. In this case, all computer units that are required for the operation, control and image output are integrated in a single personal computer. The personal computer works with an operating system capable of real time operation that supports the host computer unit and the control and image computer unit, preferably a standard operating system (for example, Windows®) that works in conjunction with a real-time operating system.

FIG. 2 shows a personal computer 2' in which the control computer unit 8' is likewise integrated. In the illustrated example, this is composed of two insert cards 9'a, 9'b, whereby the insert card 9'a serves for the transmission functions and the card 9'b serves for the reception functions. These two insert cards are also equipped with standardized connection means to the PCI bus 7' so that they can be plugged into a commercially obtainable standard PC. In this case, the two insert cards communicate with one another via a control line 18.

FIG. 3 shows a partial view of another inventive magnetic resonance system, wherein the A/D converter required for the conversion of the image signals is arranged externally relative to the personal computer. Only the component 19' arranged within the cabin 4 shown in FIG. 1 is illustrated, wherein the radio-frequency reception coil 20 is shown enlarged. This is situated in the inside of the component housing 21 and serves the purpose of receiving the high-frequency image signals. In the illustrated exemplary embodiment, the A/D converter 16' is located at a coil plug 22 with which the reception signal of the radio-frequency reception coil 20 is received. The A/D converter 16' is shielded with a shielding 17'. The converted digital signals are forwarded via a signal line 23 to the personal computer and the insert card 9" thereat. A light waveguide should preferably be utilized as signal line 23. As can also be seen from FIG. 3, the pre-amplifier 15' is also arranged at the coil plug 22.

As FIG. 3 shows, the A/D converter 16' includes a circuit 24 for scrambling the image signals that have already been digitized in order to attenuate coherent disturbances. A corresponding demodulator 25 with which the data can be restored is provided at the insert card 9".

In addition thereto, the D/A converter 12' employed for generating the waveform for the radio-frequency pulse excitation is located directly at the system component 19', or at the component housing 21 in this embodiment, i.e. not directly at the insert card, as shown in FIGS. 1 and 2.

Figure 4:
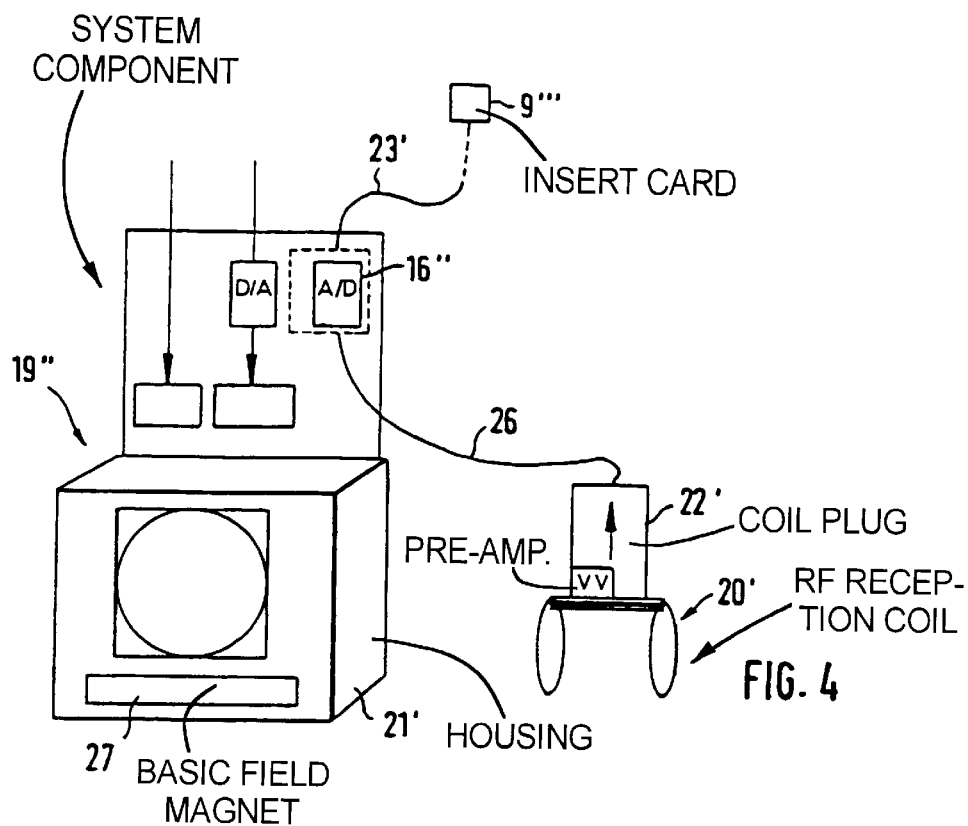
FIG. 4 shows a portion of the system of FIG. 1 with A/D converters located in the region of the magnet.

FIG. 4 shows a further embodiment, wherein the reception coil is also shown enlarged, and located externally from the system component 19". In the illustrated example, the A/D converter 16" is arranged in the region of the magnet 27 at the apparatus housing 21'. It is connected to the connector plug 22' of the radio-frequency reception coil 20' via a signal line 26. Again, the image signals digitalized with the A/D converter 16" are forwarded to the insert card 9''' via a signal line 23', which is preferably a light waveguide. As already described with respect to FIG. 3, a scrambling circuit can also be provided in this embodiment.

Figure 5:
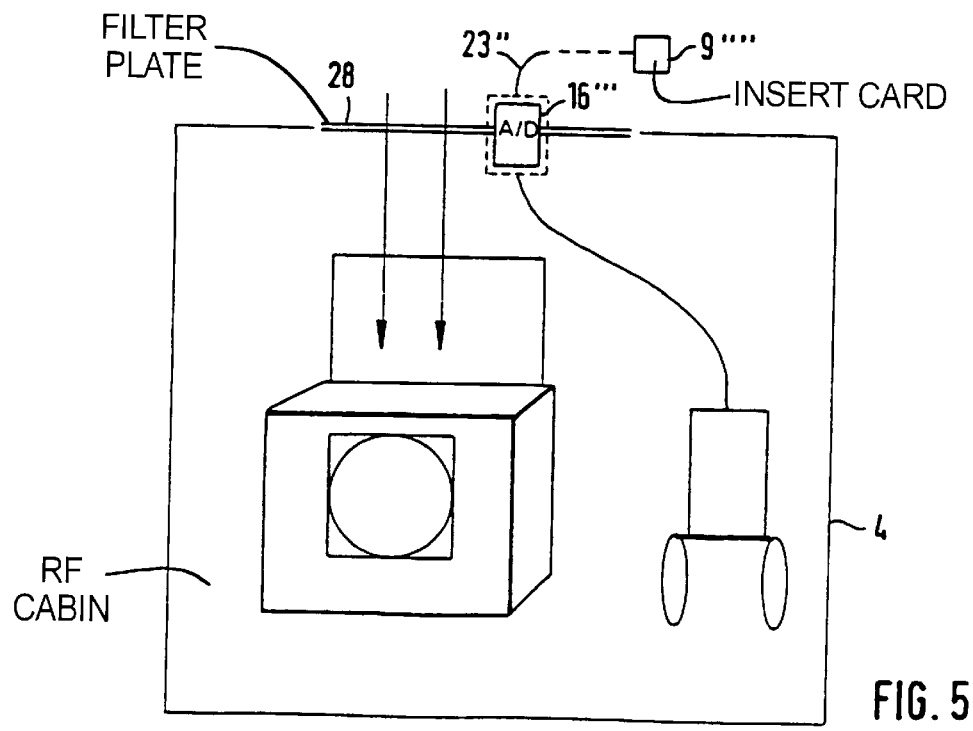
FIG. 5 shows a portion of the system of FIG. 1 with an A/D converter arranged at a filter plate.

FIG. 5 shows a third embodiment wherein the A/D converter 16''', which is also shielded like the converter 16", is arranged at a filter plate 28 of the compartment 4. It communicates with the insert card 9''' via a signal line 23".

The operation and functioning thereof corresponds to that set forth above.

Although modifications and changes may be suggested by those skilled in the art, it is the intention of the inventors to embody within the patent warranted hereon all changes and modifications as reasonably and properly come within the scope of their contribution to the art.

We claim as our invention:

1. A medical examination system comprising:
   a patient scanner which produces image data from a patient;
   a personal computer having an insert card inserted therein forming a control computer connected to said patient scanner for controlling operation of said patient scanner to obtain said image data;
   an image computer supplied with said image data for reconstructing an image of said patient therefrom; and
   said personal computer also containing a host computer, said host computer supporting operation of said control computer and said image computer.

2. A medical examination system as claimed in claim 1 wherein said personal computer comprises a main processor operating with a real time operating system which supports said host computer and said control computer formed by said insert card.

3. A medical examination system as claimed in claim 2 wherein said real time operating system comprises an operating system with a windowed user interface.

4. A medical examination system as claimed in claim 1 wherein said image computer is a further insert card inserted in said personal computer.

5. A medical examination system as claimed in claim 4 wherein said personal computer comprises a PCI bus and a main processor connected to said PCI bus, and wherein at least one of said insert card forming said control computer and said insert card for said image computer is connected to said PCI bus.

6. A medical examination system as claimed in claim 1 further comprising a signal line connected between said patient scanner and said insert card forming said control computer, on which said image data are transmitted as analog signals, and an analog-to-digital converter on said insert card forming said control computer which converts said analog signals into digital data and supplies said digital data to said control computer, and high-frequency shielding for said analog-to-digital converter.

7. A medical examination system as claimed in claim 6 further comprising high-frequency shielding for said signal line.

8. A medical examination system as claimed in claim 6 wherein said signal line comprises a light wave guide.

9. A medical examination system as claimed in claim 6 further comprising a circuit for scrambling said analog signals from said patient scanner before transmission on said signal line to said analog-to-digital converter.

10. A medical examination system as claimed in claim 1 further comprising a signal line from said patient scanner on which said image data are transmitted as analog signals, an analog-to-digital converter connected to said signal line and disposed outside of said personal computer which receives said analog signals from said signal line and converts said analog signals into digital data, and a digital signal line connecting said analog-to-digital converter to said insert card for said control computer forming supplying said digital data to said control computer.

11. A medical examination system as claimed in claim 10 wherein said patient scanner comprises a magnetic resonance imaging scanner having a basic field magnet, and wherein said analog-to-digital converter is disposed in a region of said basic field magnet.

12. A medical examination system as claimed in claim 10 wherein said patient scanner comprises a magnetic resonance imaging system having a radio-frequency shielded cabin, and wherein said medical examination system further comprises a filter plate at said radio-frequency shielded cabin, said analog-to-digital converter being disposed at said filter plate.

13. A medical examination system as claimed in claim 10 wherein said patient scanner comprises a magnetic resonance imaging scanner having a radio-frequency reception coil, and wherein said analog-to-digital converter is disposed in a region of said radio-frequency reception coil.

14. A medical examination system as claimed in claim 13 wherein said signal line comprises a connecting plug connecting said signal line to said radio-frequency reception coil, and wherein said analog-to-digital converter is disposed in said connecting plug.

15. A medical examination system as claimed in claim 14 further comprising high-frequency shielding for said connecting plug.

16. A medical examination system as claimed in claim 10 further comprising high-frequency shielding for said analog-to-digital converter.

17. A medical examination system as claimed in claim 10 wherein said signal line comprises a light wave guide.

18. A medical examination system as claimed in claim 10 further comprising a circuit for scrambling said analog signals from said patient scanner before transmission on said signal line to said analog-to-digital converter.

* * * * *